(12) United States Patent
Hooper et al.

(10) Patent No.: US 6,440,214 B1
(45) Date of Patent: Aug. 27, 2002

(54) METHOD OF GROWING A SEMICONDUCTOR LAYER

(75) Inventors: Stewart Edward Hooper, Oxon; Jennifer Mary Barnes, Middlesex; Jonathan Heffernan, Oxford; Alistair Henderson Kean, Oxfordshire, all of (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/591,119

(22) Filed: Jun. 9, 2000

(30) Foreign Application Priority Data

Jun. 12, 1999 (GB) ................................. 9913616

(51) Int. Cl.$^7$ ................................ C30B 29/38

(52) U.S. Cl. .................. 117/94; 117/95; 117/101; 117/106; 117/109; 117/7; 117/8; 117/956

(58) Field of Search ............... 117/94, 95, 101, 117/106, 107, 906, 7, 8

(56) References Cited

FOREIGN PATENT DOCUMENTS

| EP | 0383215 | 8/1990 |
| EP | 0497350 | 8/1992 |
| EP | 0607435 | 7/1994 |
| EP | 0 285 358 | 3/1998 |
| EP | 0 942 459 | 4/1998 |
| EP | 0864672 | 9/1998 |
| WO | 9216966 | 10/1992 |
| WO | 98/47170 | 10/1998 |

OTHER PUBLICATIONS

Mesrine et al.; "Efficiency of NH3 as Nitrogen Source for Gan Molecular Beam Epitaxy" vol. 72, No. 3, pp. 350–352; Jan. 19, 1998.
Grandjean et al.; "Molecular beam epitaxy growth of nitride materials" vol. 59, No. 1–3, pp. 39–46; May 6, 1999.
Alexeev et al.; The growth rate evolution versus substrate temperature and V/III ratio during GaN MBE using ammonia vol. 4, No. 6, pp. 1–5; 1999.
Briot et al.; "Influence of the V/III molar ratio on the structural and electronic properties of MOVPE grown GaN" vol. 41, No. 2; Feb. 1, 1997.
European Search Report regarding Application No. 00304900.4 dated Mar. 26, 2002.

*Primary Examiner*—Robert Kunemund
(74) *Attorney, Agent, or Firm*—Renner, Otto, Boisselle & Sklar

(57) ABSTRACT

A method of growing a nitride semiconductor layer, such as a GaN layer, by molecular beam epitaxy comprises the step of growing a GaAlN nucleation layer on a substrate by molecular beam epitaxy. The nucleation layer is annealed, and a nitride semiconductor layer is then grown over the nucleation layer by molecular beam epitaxy. The nitride semiconductor layer is grown at a V/III molar ratio of 100 or greater, and this enables a high substrate temperature to be used so that a good quality semiconductor layer is obtained. Ammonia gas is supplied during the growth process, to provide the nitrogen required for the MBE growth process.

16 Claims, 6 Drawing Sheets

METHOD OF GROWING A SEMICONDUCTOR LAYER

BACKGROUND OF THE INVENTION

1. Field of the Invention

This invention relates to a molecular beam epitaxy (MBE) method for the epitaxial growth of Group III nitride semiconductor materials, such as GaN.

2. Description of the Related Art

The epitaxial growth of Group III nitride semiconductor materials on a substrate can be effected by molecular beam epitaxy (MBE) or by chemical vapour deposition (CVD) which is sometimes known as Vapour Phase Epitaxy (VPE).

CVD (or VPE) takes place in an apparatus which is commonly at atmospheric pressure but sometimes at a slightly reduced pressure of typically about 10 kPa. Ammonia and the species providing one or more Group III elements to be used in epitaxial growth are supplied substantially parallel to the surface of a substrate upon which epitaxial growth is to take place, thus forming a boundary layer adjacent to and flowing across the substrate surface. It is in this gaseous boundary layer that decompoiltion to form nitrogen and the other elements to be epitaxially deposited takes place so that the epitaxial growth is driven by gas phase equilibria.

In contrast to CVD, MBE is carried out in a high vacuum environment. In the case of MBE as applied to the GaN system, an ultra-high vacuum (URV) environment, typically around $1\times10^{-3}$ Pa, is used. Ammonia or another nitrogen precursor is supplied to the MBE chamber by means of a supply conduit and species providing gallium and, possibly, indium and/or aluminium are supplied from appropriate sources within heated effusion cells fitted with controllable shutters to control the amounts of the species supplied into the MBE chamber during the epitaxial growth period. The shutter-control outlets from the effusion cells and the nitrogen supply conduit face the surface of the substrate upon which epitaxial growth is to take place. The ammonia and the species supplied from the effusion cells travel across the MBE chamber and reach the substrate where epitaxial growth takes place in a manner which is driven by the deposition kinetics.

GaN has a lattice constant of around 0.45 nm. There is a lack of suitable substrates that are lattice-matched to GaN, so GaN is generally grown onto either a sapphire substrate or a silicon carbide substrate. Because of the lattice mismatch between GaN and sapphire or silicon carbide, it is necessary to provide a thin initial nucleation layer on the substrate in order to grow high quality GaNs on sapphire or silicon carbide.

Akasaki and Amano report, in "Japanese Journal of Applied Physics" Vol. 36, pp5393–5408 (1997), that a thin AlN layer, deposited at a low growth temperature, can be used as a nucleation layer to promote the growth of a GaN layer by metal organic chemical vapour deposition (MOCVD) process on a sapphire or silicon carbide substrate.

U.S. Pat. No. 5,290,393 discloses the use of a GaN nucleation layer, deposited at a low growth temperature, for promoting the growth of a GaN layer using MOCVD.

The above prior art documents do not discuss the effect of thermal treatment of the nucleation layer on the properties of the subsequent GaN layer. Lin et al in "Applied Physics Letters" Vol. 68, pp3758–3760 (1996) and Sugiura et al in "Journal of Applied Physics" Vol. 82, p4877–4882 (1997) report that controlled annealing of the nucleation layer can improve the quality of the subsequent GaN layer. Both of these studies on the effect of annealing the nucleation layer were carried out for GaN layers grown by MOCVD.

At present, the majority of growth of high quality GaN layers is carried out using the MOCVD process. The MOCVD process allows good control of the growth of the nucleation layer and of the annealing of the nucleation layer. Furthermore, the MOCVD process allows growth to occur at a V/III molar ratio well in excess of 1000:1. (The V/Ill molar ratio is the molar ratio of the group V element to the Group III element during the growth process. A high V/III molar ratio is preferable, since this allows a higher substrate temperature to be used leading to a higher quality GaN layer.)

At present, growing high quality GaN layers by MBE is more difficult than growing such layers by MOCVD. The principal difficulty is in supplying sufficient nitrogen during the growth process; it is difficult to obtain a V/III molar ratio of 10:1 or greater. The two commonly used sources of nitrogen in the MBE growth of nitride layers are plasma excited molecular nitrogen or ammonia.

U.S. Pat. No. 5,385, 862and WO 92/16966 disclose a method of growing a single crystal GaN film on a sapphire substrate using MBE. In this method, the nitrogen used in the growth process is activated nitrogen obtained by exciting molecular nitrogen using a plasma source. In this method, the growth of the initial nucleation layer is restricted to a growth temperature of 400° C. or lower, and the growth of the subsequent GaN layer is restricted to a growth temperature of lower than 900° C. This patent discloses a step of crystallising the GaN nucleation layer, but specifies no time period for this step. GaN layers grown by this method have electron mobilities at room temperature of less than 100 $cm^2V^{-1}S^{-1}$.

A method of growing GaN by MBE in which ammonia is used as the nitrogen source is reported by Yang et al in "Applied Physics Letters" Vol 67, pp1686–1688 (1995). In this prior art method, a GaN nucleation layer is grown using nitrogen obtained from plasma excited molecular nitrogen, and the nucleation layer is not annealed. The subsequent GaN semiconductor layer is grown at the low growth temperature of 750° C. due to the low V/III molar ratio of the growth process. This method produces GaN layers having a room temperature mobility of less than 100 $cm^2V^{-1}s^{-1}$.

Further reports on the grown of GaN layers using MBE, with ammonia as the nitrogen source, have been made by Grandjean et al in (1) "Journal of Applied Physics" Vol 83, pp1379–1383 (1998) and (2) "Applied Physics Letters" Vol 71, p240–242 (1997). Both of these documents report methods in which a GaN nucleation layer is used. The nucleation layer is annealed, although at the low temperature of 900° C. owing to the low quantity of ammonia present during the annealing step. The subsequently grown GaN layer is grown at a low growth temperature of 830° C. owing to the low V/III ratio obtained in the growth process. Grandjean et al (1) report a V/III ratio (atomic nitrogen to gallium) of 3–5:1 (equivalent to a molar ratio of about 60–100:1), whereas Grandjean et al (2) do not give a value for the V/III ratio. The methods reported in these two documents produce GaN layers having a room temperature electron mobility of less than 150 $cm^2V^{-1}s^{-1}$.

EP-A-0 607 435 discloses a method of growing a nitride semiconductor material by MBE. The method comprises growing a thin layer of an oriented polycrystalline nitride semiconductor material on a substrate, and subsequently growing a single crystal nitride semiconductor layer on the thin polycrystalline layer. The polycrystalline layer is not annealed, so that the thin layer will retain its polycrystalline structure when the single crystal layer is grown.

EP-A-0 497 350 relates to the growth of a GaN layer on a sapphire substrate by an MOCVD process. A GaAlN buffer layer is grown on the substrate, and a GaN layer is grown on the buffer layer. This document investigates how changes in the composition of the buffer layer affect the quality of the epitaxial layer.

It can therefore be seen that it is desirable to make possible a method for growing high mobility GaN layers using the MBE process. In order to do this, it is necessary to increase the growth temperatures of the GaN layer. The growth temperature is important in order to achieve polycrystalline material and good surface coverage. The annealing temperature is important in order to crystallise and flatten the nucleation layer.

SUMMARY OF THE INVENTION

A first aspect of the present invention provides a method of growing a nitride semiconductor layer by molecular beam epitaxy, the method comprising the steps of:

(a) disposing a substrate in a vacuum chamber;
(b) growing a nucleation layer of $Ga_xAl_{1-x}N$ ($0 \leq x \leq 1$) on the substrate by molecular beam epitaxy;
(c) annealing the $Ga_xAl_{1-x}N$ layers; and
(d) growing a nitride semiconductor layer on the $Ga_xAl_{1-x}N$ layer by molecular beam epitaxy at a V/III molar ratio within the vacuum chamber of 100:1 or greater; wherein the method further comprises supplying ammonia gas to the vacuum chamber in step (b) and step (d).

Because the growth of the GaN layer is carried out at a V/III molar ratio within the vacuum chamber of 100:1 or greater in the present invention, the growth process can be carried out at a higher temperature. In consequence, the present invention produces a higher quality nitride semiconductor layer than do the prior art methods. The present invention can produce, for example a GaN layer having an electron mobility at room temperature greater than 250 $cm^2V^{-1}s^{-1}$. This mobility compares favourably with the mobilities obtained by the MOCVD method. Moreover, supplying ammonia gas to the vacuum chamber in step (b) and step (d) is a convenient way of providing the nitrogen required for the MBE growth process, and eliminates the need to generate a nitrogen or ammonia plasma to provide activated nitrogen.

Step (d) may comprise growing the nitride layer at a V/III molar ratio within the vacuum chamber of 500:1 or greater or at a V/III molar ratio within the vacuum chamber of 1000:1 or greater. Step (d) may comprise growing the nitride layer at a V/III molar ratio within the vacuum chamber in the range 100:1–10,000:1.

Step (b) may comprise growing the $Ga_xAl_{1-x}N$ layer at a V/III molar ratio within the vacuum chamber of at least 100:1. It may comprise growing the $Ga_xAl_{1-x}N$ layer at a V/III molar ratio within the vacuum chamber in the range 100:1–10,000:1.

The thickness of the $Ga_xAl_{1-x}N$ layer grown in step (b) may be within the range 5–200 nm.

The substrate temperature during step (b) may be within the range 400–600° C.

Step (a) may comprise supplying ammonia gas to the vacuum chamber during the step of annealing of the $Ga_xAl_{1-x}N$ layer.

The substrate temperature during the step of annealing of the $Ga_xAl_{1-x}N$ layer may be 950–1050° C.

The duration of the step of annealing the $Ga_xAl_{1-x}N$ layer may be between 0 and 90 minutes.

The duration of the step of annealing the $Ga_xAl_{1-x}N$ layer may be approximately 45 minutes and the thickness of the nucleation layer may be 20 nm. Alternatively, the duration of the step of annealing the $Ga_xAl_{1-x}N$ layer may be approximately 15 minutes and the thickness of the nucleation layer may be 70 nm.

The substrate temperature during step (d) may be within the range 900–1050° C.

A second aspect of the present invention provides a nitride semiconductor layer grown by a method defined above.

A third aspect of the present invention provides a semiconductor device comprising a nitride semiconductor layer defined above.

BRIEF DESCRIPTION OF THE DRAWINGS

Preferred embodiments of the present invention will now be described by way of illustrative example with reference to the accompanying figures in which.

DESCRIPTION OF THE PREFERRED EMBODIMENTS

An example of the present invention, illustrating the growth of a GaN layer will now be described.

A suitable substrate is prepared in a conventional manner, and is introduced into the growth chamber of a MBE apparatus. The substrate is preferably sapphire, but could also be silicon carbide, monocrystaline silicon, zinc oxide, or magnesium oxide. The growth chamber will typically be evacuated to a high degree of vacuum, and the substrate is generally introduced into the growth chamber through an airlock.

The substrate is initially heated up to a temperature of around 1,000° C. This is a step of baking the substrate, to remove contaminants. The rate at which the temperature is increased should not be so great that uneven temperature distribution occurs in the substrate, since this would lead to thermal stresses in the substrate. A temperature ramp rate of 10–120° C. per minute is found to be suitable.

If desired, the substrate can be exposed to ammonia during the thermal baking step to achieve nitridation of the surface.

Once the thermal baking step has been completed, the temperature of the substrate is reduced to a temperature in the range 400–600° C. Ammonia gas and elemental gallium are supplied to the growth chamber to give a V/III molar ratio in the growth chamber of between 100:1 and 10,000:1 so that a GaN layer is grown on the substrate by MBE. The GaN layer acts as a nucleation layer in subsequent growth steps. The thickness of the nucleation layer is preferably within the range of 5 to 200 nm.

Figure 1:
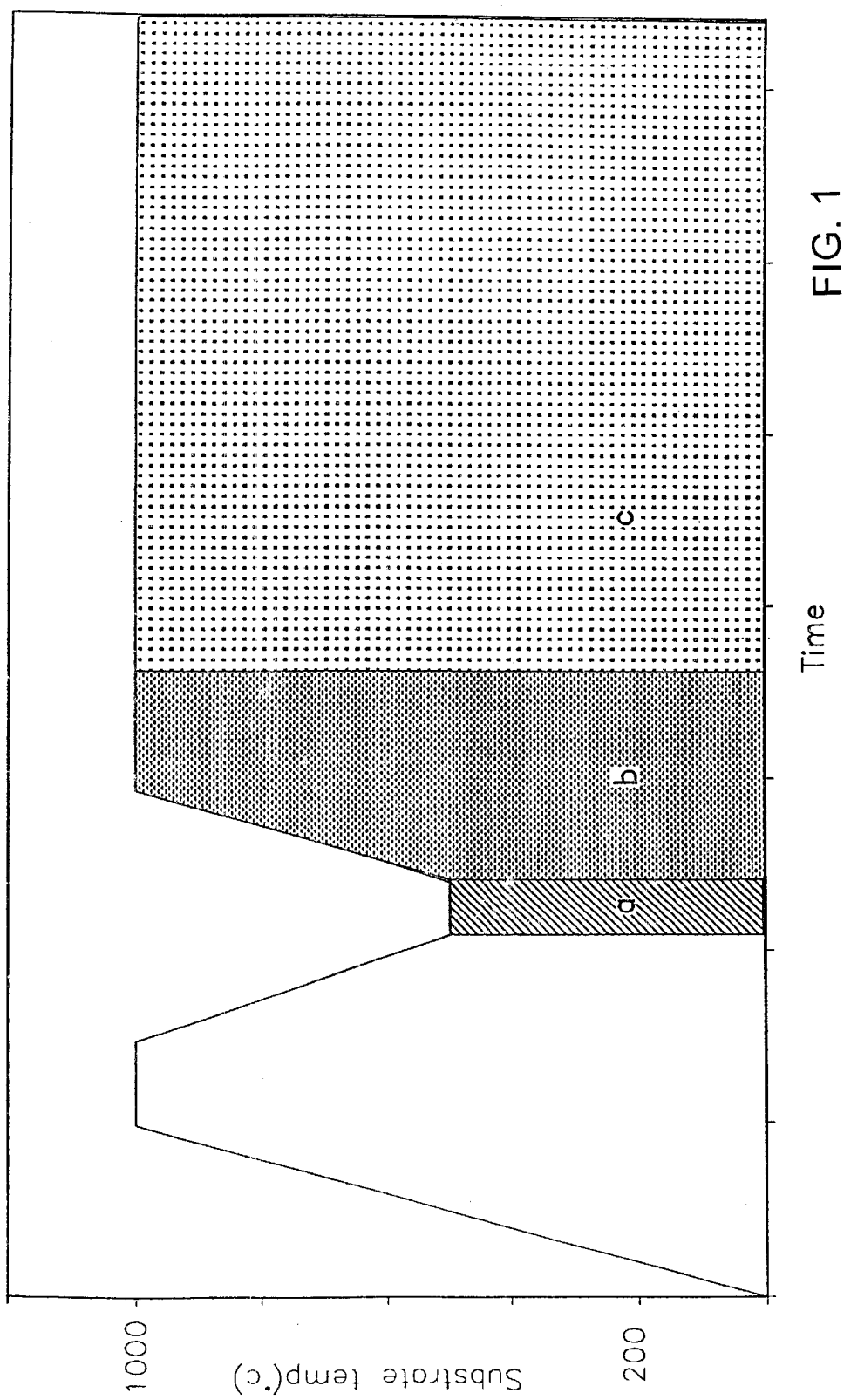
FIG. 1 is a schematic illustration of the substrate temperature against time during a growth process according to one embodiment of the present invention.

The step of growing the nucleation layer is indicated as (a) in FIG. 1.

Once the nucleation layer has been grown, the substrate temperature is increased to a temperature between 950 and 1,050° C. The temperature ramp rate must be chosen to prevent undue thermal stress within the substrate, and also between the substrate and the nucleation layer (which have different coefficients of expansion), and a temperature ramp rate in the range 10–120° C. per minute is suitable. The temperature is then maintained at this value and the nucleation layer is annealed, preferably under an ammonia flux. This stage is illustrated as (b) in FIG. 2.

The duration of the annealing step is preferably between 0 and 90 minutes.

A GaN nucleation layer grown at a temperature in the range 400–600° C. will have a polycrystalline structure. When the nucleation layer is annealed, its crystal structure will change from polycrystalline to monocrystalline.

Once the annealing step has been concluded, a GaN semiconductor layer is grown over the nucleation layer. The substrate temperature during this step is kept within the range 900–1,050° C. The rates of supply of the ammonia gas and elemental gallium are chosen to give a V/III molar ratio of at least 100:1 in the reaction chamber, and the GaN layer is grown by molecular beam epitaxy. Although the V/III molar ratio in the growth chamber can have any value within the range between 100:1 to 10,000:1, since the highest possible substrate temperature during the growth step increases as the V/III molar ratio within the growth chamber increases, the V/III molar ratio in the growth chamber is preferably greater than 500:1 and more preferably greater than 1,000:1.

In the present invention, ammonia gas is supplied to the growth chamber of the MBE apparatus to provide the nitrogen required for the growth of the GaN nucleation layer and the GaN semiconductor layer. The present invention does not require the generation of activated nitrogen, for example using a plasma source, to provide the nitrogen for the MBE growth process.

Figure 2:
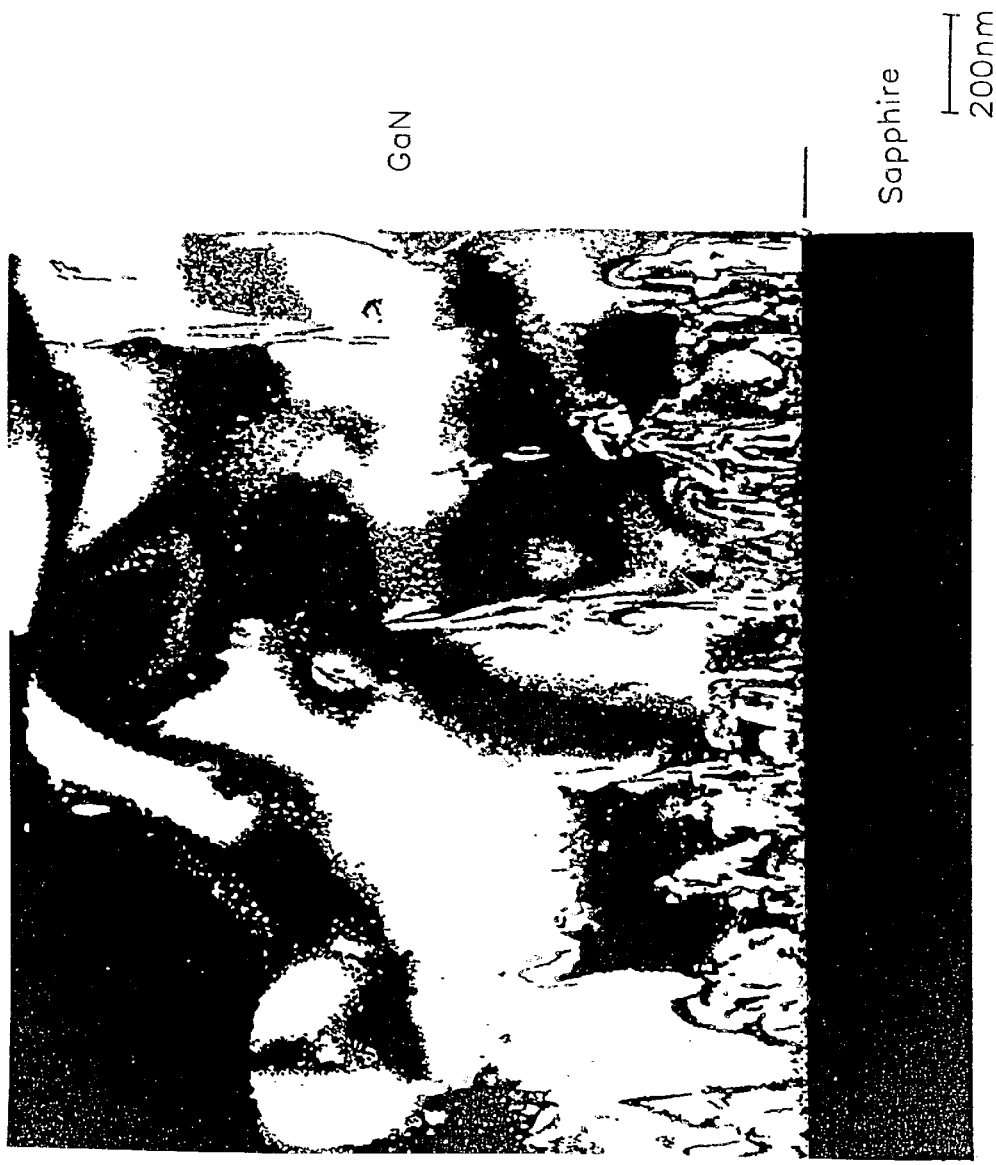
FIG. 2 is cross-sectional transmission electron micrograph of a layer of GaN grown using a method of the present invention.

FIG. 2 is a cross-sectional transmission electron micrograph of a GaN layer grown by a molecular beam epitaxy method of the present invention. FIG. 2 shows the cross section of a non-intentionally doped GaN layer having a thickness of 4 $\mu$m. It will be noted that the upper 3 $\mu$m of the GaN layer are relatively free of threading dislocations. The density of threading dislocations in the top 3 $\mu$m of the GaN layer of FIG. 2 is approximately $8 \times 10^8$ cm$^{-2}$. In contrast, a GaN layer grown by a conventional MBE method would be expected to have a density of threading dislocations of at least $5 \times 10^9$ cm$^{-2}$, according to Grandjean et al (1) above. A typical density of threading dislocations in GaN grown by MOCVD is between $10^8$ to $10^{10}$ cm$^{-2}$, according to Lester et al "Applied Physics Letters" Vol 66, pp1249–1251 (1995).

Room temperature Hall effect measurements of non intentionally doped GaN films grown using a molecular beam epitaxy method of the present invention typically yield carrier concentrations (n-type) less than $5 \times 10^{17}$ cm$^{-3}$, and also yield electron mobilities greater than 250 cm$^2$V$^{-1}$s$^{-1}$.

These results compare favourably with values for typical MOCVD GaN material as reported by Akasaki and Amano (above).

Figure 3:
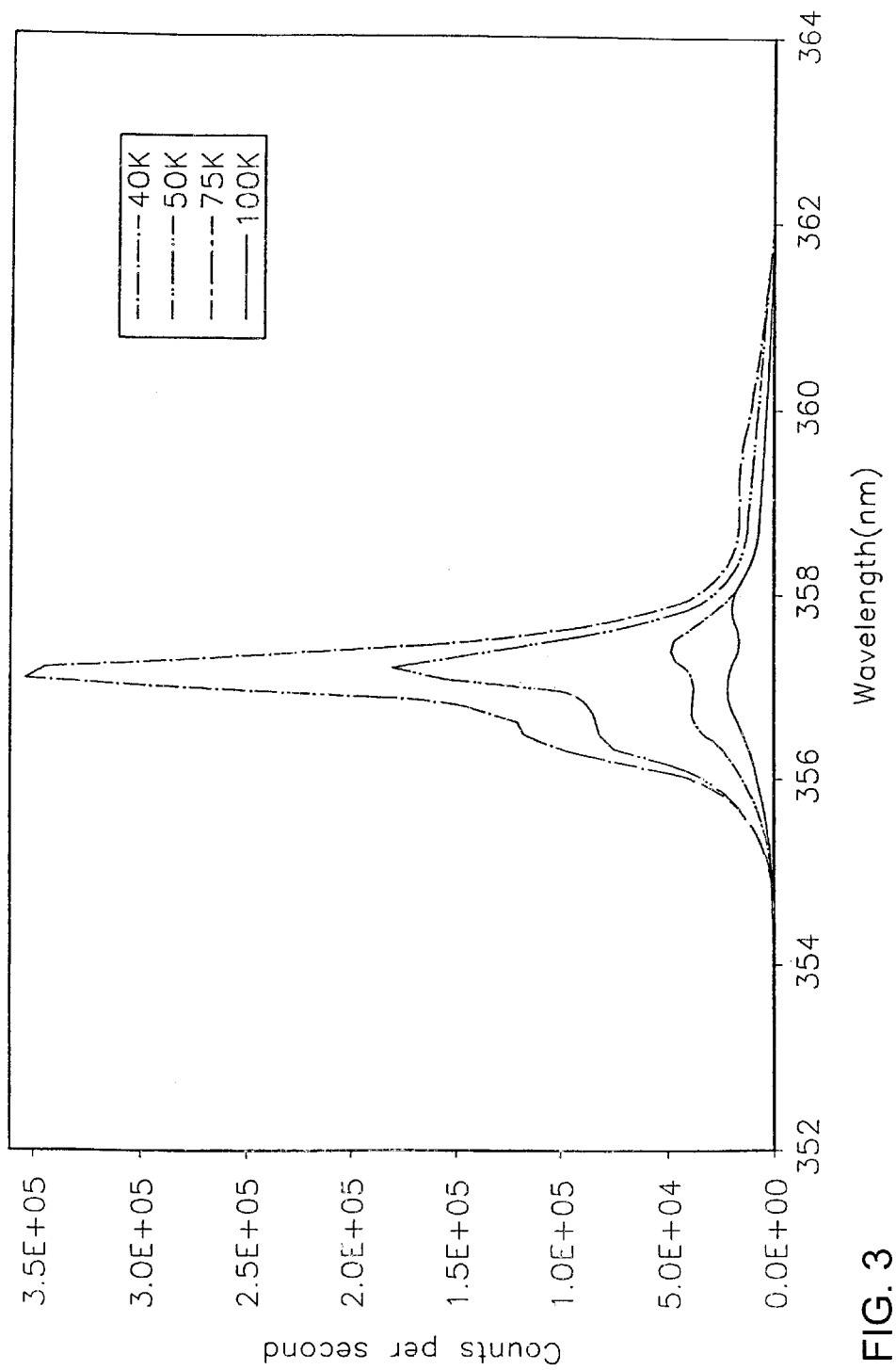
FIG. 3 shows photoluminescence spectra, at four different temperatures, of a non-intentionally doped GaN layer grown using a method of the present invention.

FIG. 3 illustrates the photoluminescence spectrum of non-intentionally doped GaN layer grown using a molecular beam epitaxy method of the present invention. The spectrum is shown at four different temperatures. It will be seen that the spectrum is dominated by near band edge emission, including a free exciton peak. Such a photoluminescence spectrum is indicative of a high quality GaN layer.

Figure 4:
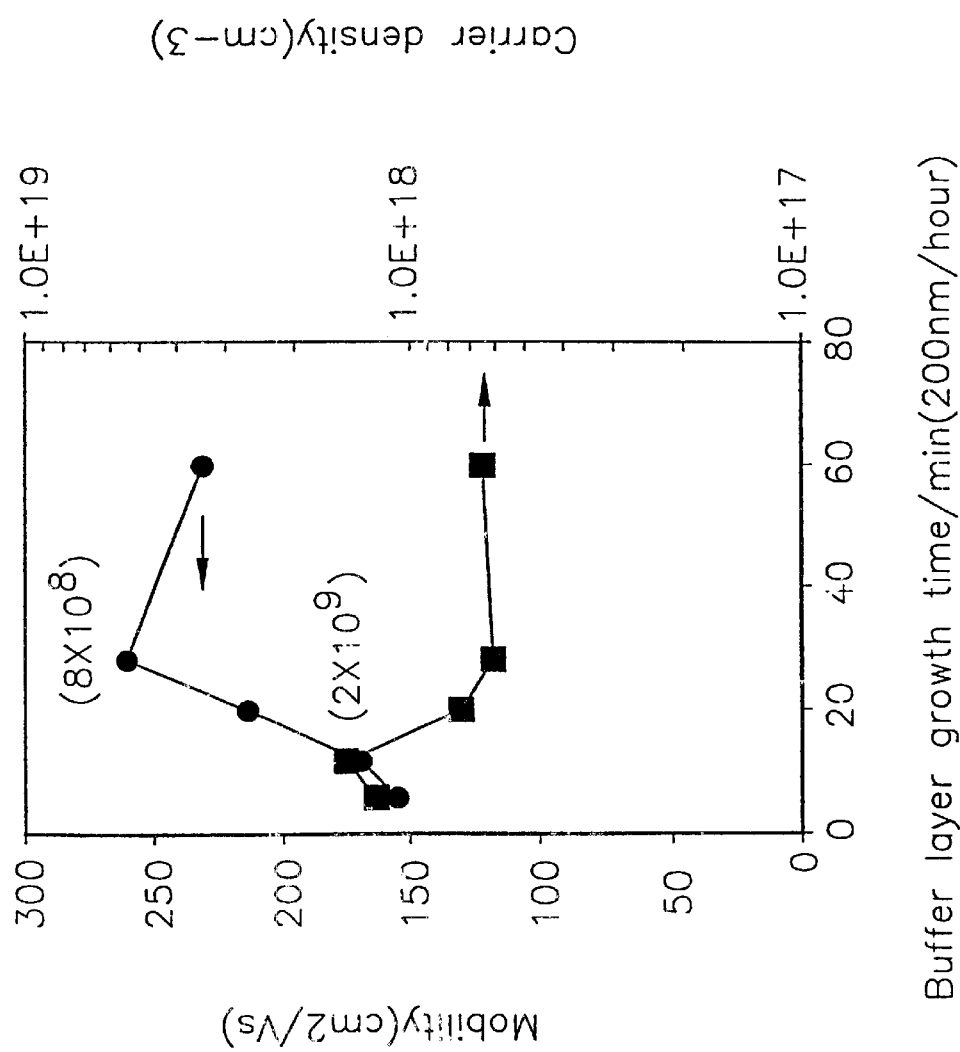
FIG. 4 shows the effect of the thickness of a GaN nucleation layer on the carrier density and mobility of a subsequent GaN layer grown by a MBE growth method of the present invention.

FIG. 4 illustrates the effect of the thickness of the GaN nucleation layer on the carrier concentration and carrier mobility of the subsequent GaN layer. The duration of the annealing step is 15 minutes for all thicknesses of the buffer layer. For this annealing time, a thickness of 70 nm is preferable for the nucleation layer, as this provides the highest mobility and the lowest carrier concentration.

Figure 5:
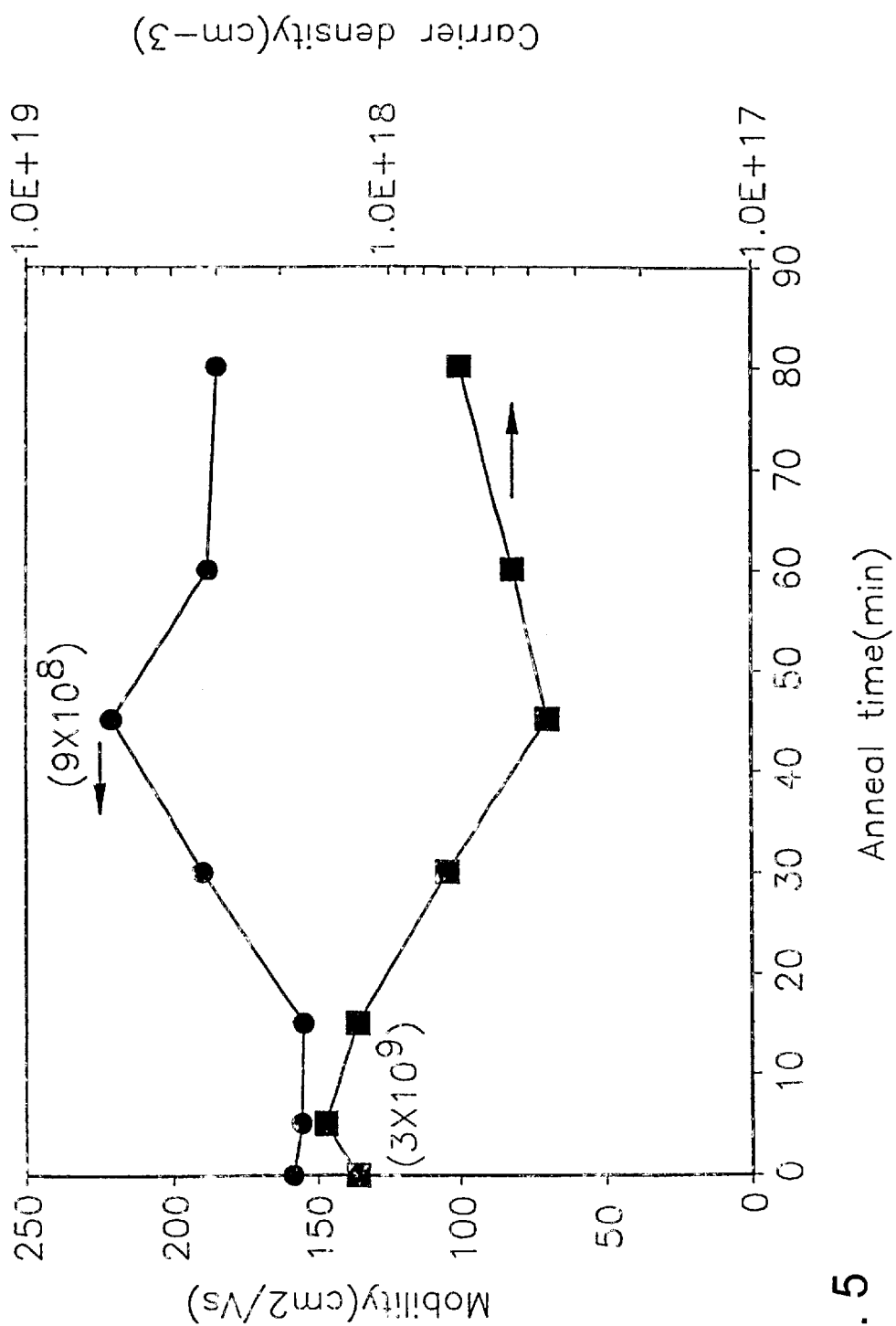
FIG. 5 shows the effect of the duration of the annealing step of a GaN nucleation layer on the carrier density and mobility of a subsequent GaN layer grown using a MBE method of the present invention.

FIG. 5 illustrates the effect of the annealing time on the carrier mobility and carrier density of the subsequent GaN layer. This data was obtained with a nucleation layer having a thickness of 20 nm and, for this thickness of nucleation layer, an annealing period of 45 minutes is found to obtain the highest mobility and the lowest carrier concentration.

The use of a high V/III molar ratio within the growth chamber during the growth process of the present invention allows a nitride semiconductor layer to be grown at temperatures well above those used in prior art MBE methods. This leads to improved material quality. Compared to a MOCVD process, the MBE growth process of the present invention requires at least one thousand times less ammonia gas.

The present invention requires a MBE growth apparatus that can achieve a V/III molar ratio of more than 100:1 within the growth chamber during the growth process. Such high V/III molar ratios can be achieved, for example, in a MBE growth apparatus in which ammonia gas is introduced into the growth chamber through a conduit whose outlet end is placed as close to the substrate as possible without radiative heat from the substrate causing excessive local heating of the outlet of the supply conduit. The elemental gallium is introduced into the growth chamber using a conventional effusion cell. Further effusion cells can be used to supply aluminium and/or indium and/or an elemental dopant for incorporation into the epitaxial growth material as necessary.

Figure 6:
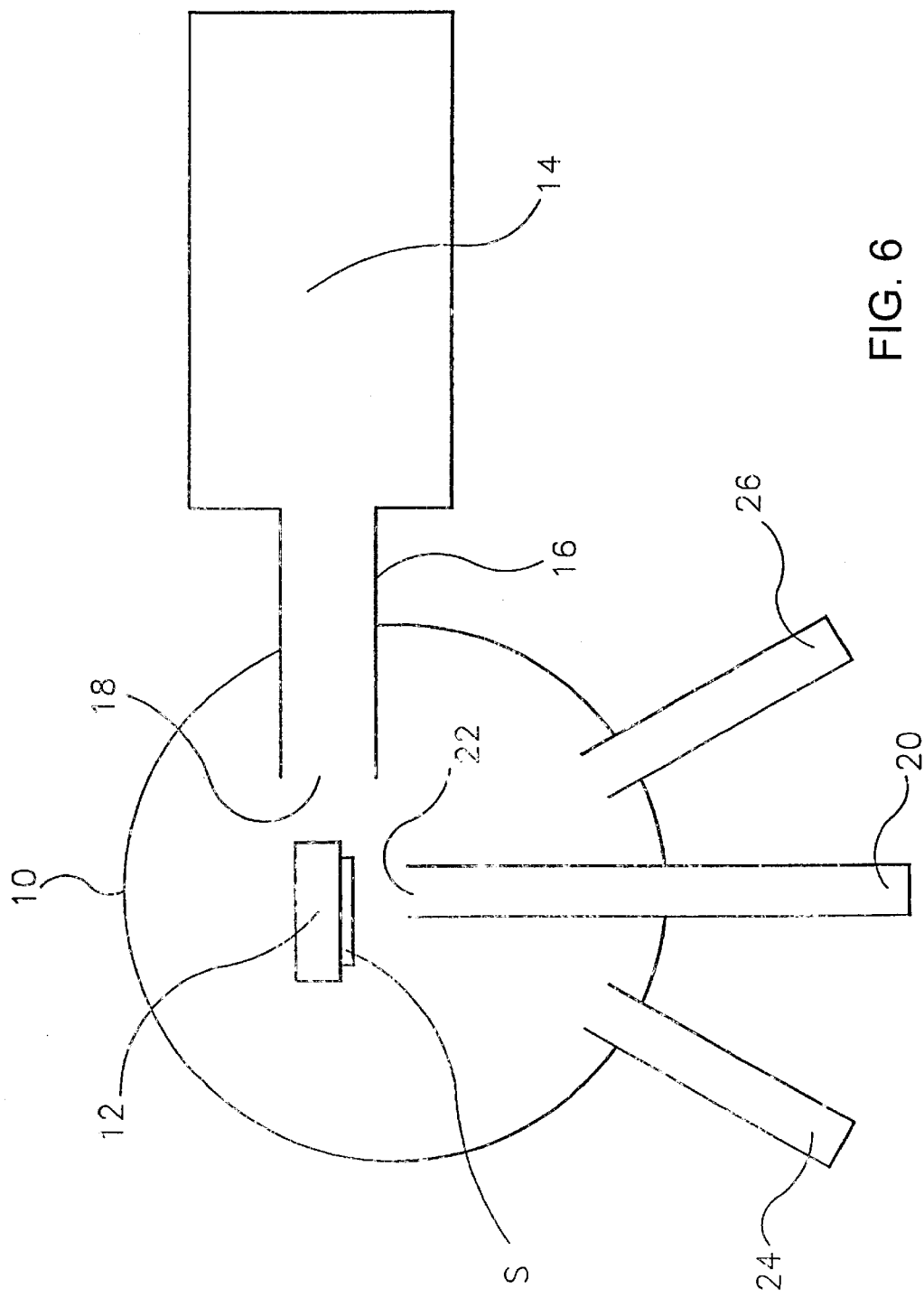
FIG. 6 is a schematic diagram of an MBE chamber suitable for putting the method of the invention into effect.

FIG. 6 is a schematic view of an apparatus suitable for the growth of a nitride semiconductor material by molecular beam epitaxy according to a method of the present invention. The apparatus comprises a vacuum chamber 10 in which is disposed a heated support 12 arranged to support and heat a substrate S. The vacuum is chamber 10 is connected with an ultra-high vacuum pump 14 via an exhaust conduit 16 which extends into the vacuum chamber 10. The inner end of the exhaust conduit 16 defines a vacuum outlet 18 of the vacuum chamber 10. The vacuum outlet 18 is disposed adjacent to the substrate support 12. In the MBE apparatus of FIG. 6 MBE growth occurs in the vacuum chamber 10, which thus functions as the growth chamber of the apparatus.

The vacuum chamber 10 is further provided with a first supply conduit 20 which extends into the vacuum chamber so that an outlet 22 of the first supply conduit 20 is adjacent to and faces the surface of the substrate S upon which epitaxial growth is to take place. The first supply conduit 20 can be adjustably mounted relative to the chamber so that the relatively stall distance between the outlet 22 of the first supply conduit 20 and the epitaxial growth surface of the substrate S can be varied during the epitaxial growth process. The longitudinal axle of the first supply conduit 20 is substantially perpendicular to the plane of epitaxial growth.

The first supply conduit 20 is used to supply ammonia which is the precursor of the nitrogen required in the epitaxial growth process. Because the outlet 22 of the first supply conduit 20 is positioned relatively close to the substrate S, a relatively high ammonia vapour pressure is localised at the surface of the epitaxially growing material while still enabling an ultra-high vacuum environment within the vacuum chamber 10 to be achieved by the pump 14. The high ammonia vapour pressure enables a high V/III molar ratio to be realised within the vacuum chamber 10 during the growth process.

The apparatus further comprises independently operable, shutter-controlled effusion cells 24, 26 (two such cells are shown in FIG. 6) which contain sources of elemental gallium and another element (for example, aluminium, indium or a dopant) which may be required during the epitaxial growth process. The effusion cells 24 and 26 are conventionally positioned and define second and further supply conduits respectively.

A MBE apparatus of the type described above is described in European Patent Application No. 98301842.5, the contents of which are hereby incorporated by reference. It should be noted, however, that the present invention is not limited to a MBE apparatus of the type described in European Patent Application No. 98301842.5/0 864 672, but can be carried out in any MBE growth apparatus that can provide the required V/III molar ratio within the growth chamber.

In the embodiment described above, the nucleation layer is a GaN layer. The nucleation layer is not limited to this, however, and can be formed of $Ga_xAl_{1-x}N$ where $0 \leq x \leq 1$.

Although the embodiment described above relates to the growth of a GaN layer, the invention is not limited to this, but can be used for the growth of other nitride semiconductor layers. For example, GaAlN and GaInN can also be grown by a method of the present invention.

In the embodiment described above, the GaN layer that is grown is not intentionally doped. It is, however, possible to dope the GaN layer by introducing a suitable dopant during the MBE growth process, in a manner which is well known per se. Suitable dopants include silicon, tin, germanium, magnesium, calcium, carbon, beryllium and indium.

Once the nitride semiconductor layer has been grown by a molecular beam epitaxy method of the present invention, further semiconductor layers can be grown so as to produce an (Al,Ga,In)N electronic or optoelectronic device. For example, a GaN layer grown by a method of the present invention can be used as the basis for a laser device emitting light in the wavelength range 380–450 nm.

What is claimed is:

1. A method of growing a nitride semiconductor layer by molecular beam epitaxy, the method comprising the steps of:
   a) disposing a substrate in a vacuum chamber;
   b) growing a layer of $Ga_xAl_{1-x}N$ ($0 \leq x \leq 1$) on the substrate by molecular beam epitaxy;
   c) annealing the $Ga_xAl_{1-x}N$ layer to change from polycrystalline to mono-crystalline in crystal structure; and
   d) growing a nitride semiconductor layer on the $Ga_xAl_{1-x}N$ layer by molecular beam epitaxy at a V/III molar ratio within the vacuum chamber of 100:1 or greater;
   wherein the method further comprises supplying ammonia gas to the vacuum chamber in step (b) and step (d).

2. A method as claimed in claim 1 wherein step (d) comprises growing the nitride layer at a V/III molar ratio within the vacuum chamber of 500:1 or greater.

3. A method as claimed in claim 1 wherein step (d) comprises growing the nitride layer at a V/III molar ratio within the vacuum chamber of 1000:1 or greater.

4. A method as claimed in claim 1 wherein step (d) comprises growing the nitride layer at a V/III molar ratio within the vacuum chamber in the range 100:1–10,000:1.

5. A method as claimed in claim 1 wherein step (b) comprises growing the $Ga_xAl_{1-x}N$ layer at a V/III molar ratio within the vacuum chamber of at least 100:1 in step (b).

6. A method as claimed in claim S wherein step (b) comprises growing the $Ga_xAl_{1-x}N$ layer at a V/III molar ratio within the vacuum chamber in the range 100:1–10,000:1 in stop (b).

7. A method as claimed in claim 1 wherein the thickness of the $Ga_xAl_{1-x}N$ layer grown in step (b) is within the range 5–200 nm.

8. A method as claimed in claim 1 wherein step (b) comprises growing the $Ga_xAl_{1-x}N$ layer at a substrate temperature within the range 400–600° C.

9. A method as claimed in claim 1, further comprising supplying ammonia gas to the vacuum chamber during the step of annealing the $Ga_xAl_{1-x}N$ layer.

10. A method as claimed in claim 1 wherein the substrate temperature during the step of annealing the $Ga_xAl_{1-x}N$ layer is 950–1050° C.

11. A method as claimed in claim 1 wherein the duration of the step of annealing the $Ga_xAl_{1-x}N$ layer is between 0 and 90 minutes.

12. A method as claimed in claim 11 wherein the duration of the step of annealing the $Ga_xAl_{1-x}N$ layer is approximately 45 minutes and the thickness of the nucleation layer is 20 nm.

13. A method as claimed in claim 11 wherein the duration of the step of annealing the $Ga_xAl_{1-x}N$ layer is approximately 15 minutes and the thickness of the nucleation layer is 70 nm.

14. A method as claimed in claim 1 wherein the substrate temperature during step (d) is within the range 900–1050° C.

15. A nitride semiconductor layer grown by a method defined in claim 1.

16. A semiconductor device comprising a nitride semiconductor layer as claimed in claim 15.

* * * * *